United States Patent [19]

Suzuki et al.

[11] Patent Number: 4,549,137
[45] Date of Patent: Oct. 22, 1985

[54] NUCLEAR MAGNETIC RESONANCE DIAGNOSTIC APPARATUS

[75] Inventors: Hirokazu Suzuki; Kozo Satoh, both of Yokohama, Japan

[73] Assignee: Tokyo Shibaura Denki Kabushiki Kaisha, Japan

[21] Appl. No.: 506,290

[22] Filed: Jun. 21, 1983

[30] Foreign Application Priority Data

Jun. 21, 1982 [JP] Japan ................................ 57-106501

[51] Int. Cl.⁴ ............................................ G01R 33/08
[52] U.S. Cl. ..................................... 324/309; 324/314
[58] Field of Search ............... 324/307, 309, 310, 311, 324/313, 314

[56] References Cited

U.S. PATENT DOCUMENTS

| 4,021,726 | 5/1977 | Garroway et al. | 324/309 |
| 4,184,110 | 1/1980 | Hinshaw | 324/313 |
| 4,422,042 | 12/1983 | Sugimoto | 324/309 |
| 4,443,761 | 4/1984 | Levitt | 324/311 |

FOREIGN PATENT DOCUMENTS 2091424 7/1982 United Kingdom ................ 324/307

OTHER PUBLICATIONS

Garroway et al., "Image Formation in NMR by a Selective Irradiative Process," J. Phys., vol. 7, 1974.

Primary Examiner—Ernest F. Karlsen
Assistant Examiner—Kevin D. O'Shea
Attorney, Agent, or Firm—Finnegan, Henderson, Farabow, Garrett & Dunner

[57] ABSTRACT

Nuclear magnetic resonance diagnostic apparatus including means for applying a gradient magnetic field to form an equivalent plane in the magnetic field corresponding to the slice in the predetermined region to be measured for the acquisition of projection data, means for selectively saturating magnetization vectors in the entire region other than the region corresponding to the slice by applying radio frequency signal composed of continuous waves the frequency of which is successively varied in the range of the resonance frequency of the specified atomic nuclei and means for obtaining the projection data in the predetermined directions in the slice by measuring the resonance signals obtained by applying the 90° pulses of resonance frequency of the specified atomic nuclei to the region to be measured while the saturation state of magnetization vectors is maintained.

4 Claims, 13 Drawing Figures

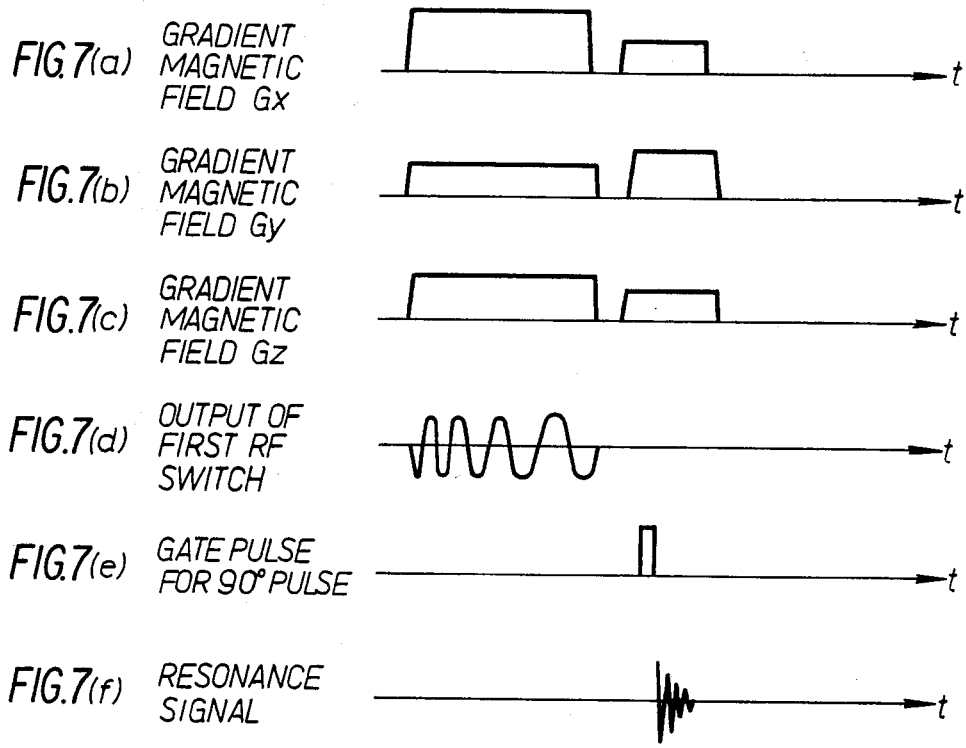

NUCLEAR MAGNETIC RESONANCE DIAGNOSTIC APPARATUS

FIELD OF THE INVENTION

This invention relates to nuclear magnetic resonance (NMR) diagnostic apparatus which can obtain two-dimensional density distribution images of specified atomic nuclei on a slice of an object. By using nuclear magnetic resonance phenomena, projection data is obtained in respect to the distribution of the specified atomic nuclei in a variety of directions on the object's slice. Reconstruction of the image uses the projection data. More particularly the invention relates to NMR diagnostic apparatus having an improved data acquisition device for capturing the projection data described above.

BACKGROUND OF THE INVENTION

There are NMR diagnostic apparatus in which the density distribution of specified atomic nuclei, such as the atomic nuclei of hydrogen in certain tissues of a living body, can be measured in a non-invasive manner from outside of the object utilizing NMR phenomena to obtain useful information for medical diagnostic purposes.

There has been diagnostic nuclear magnetic resonance computerized tomography apparatus (NMR-CT) which apply such NMR techniques using computerized tomography (CT) apparatus. The density distribution images of specified atomic nuclei in an object's slice can be reconstructed by a computer on the basis of the projection data of the specified atomic nuclei density distribution in the various directions on the object's slice that are acquired with NMR techniques.

One example of conventional NMR diagnostic apparatus is described in U.S. Pat. No. 4,254,778.

First, a static magnetic field is generated by four electromagnetic coils C1 shown in FIGS. 1(a) and 1(b). A gradient magnetic field is generated by gradient magnetic field coils C2. C3 and C4 shown in FIGS. 2 and 3 are superimposed on the static field. Coils C2, C3 and C4 are installed to be combined with coils C1.

Such a situation is schematically illustrated in FIG. 4. Initially, the static field Hzo due to coils C1 is applied to the object with the gradient field Gz due to coils C2. The gradient field Gz is established by flowing current in the reverse direction in a pair of coils of the Helmholtz type shown in FIG. 2. Therefore, the direction of its magnetic force lines is the same (the Z-direction) as that of the static field Hzo. Also, the strength of the gradient field is zero at the center plane between the two coils C2, and its absolute value increases linearly from the center plane to either side thereof, but the direction of the field strength is opposite one another.

Next, when a selective exciting pulse H1 having an appropriate frequency component is applied to the composite magnetic field through a pair of probe-head coils C5 shown in FIG. 5, resonance occurs only in a plane in which a resonance frequency determined by the local field due to the fields Hzo and Gz is equivalent to the frequency of the pulse H1. A gradient magnetic field GR formed by a combination of the magnetic fields GX and GY is applied to the plane of resonance. Measured through coils C5 is a free induction decay (FID) signal which is Fourier transformed to obtain the projection data of density distribution of atomic nuclei, for example, hydrogen along the gradient field GR in the selected plane. If projection data along a variety of directions is obtained by shifting the gradient field GR direction, the hydrogen nuclei density distribution image in a slice of the object is reconstructed using well-known techniques of X-ray computerized tomography.

On the other hand, the multi-sensitive point imaging technique is known as one technique which does not require the above-mentioned image reconstruction as is discussed in Hinshaw, Journal of Applied Physics, Vol. 47, No. 8, August 1976. Such a technique operates on the principle that the gradient magnetic field is oscillated by flowing an alternate current into the gradient magnetic field coils and in the meantime FID signals are continuously measured for integration, resulting in signals only on the center line in which the gradient field is not changed with time.

However it is extremely difficult to obtain a distinct selectively excited slice or tomographic plane (which is in fact constituted as a planar region of certain thickness) by the above-mentioned methods.

That is, in the case of the selective exciting method, forming completely selective exciting pulses is in fact substantially impossible while in the case of the multi-sensitive point method the magnitude of the magnetic field is successively varied with the position. Therefore, according to both methods the border or interface between the region where the magnetic field is not varied and the neighboring region is indefinite, thereby resulting in a blur of the selected plane.

SUMMARY OF THE INVENTION

It is therefore an object of this invention to provide nuclear magnetic resonance diagnostic apparatus wherein a more distinct slice is formed in an object without using the selective excitation or sensitive point method.

Briefly, this and other objects are achieved in accordance with a first aspect of the invention by NMR diagnostic apparatus for producing the density distribution of specified atomic nuclei in a slice of an object by image reconstruction using projection data of the specified atomic nuclei density distribution which is obtained in a plurality of directions in the plane of the slice of the object. The apparatus comprises means for applying a gradient magnetic field which at a particular gradient level forms an equivalent plane in the magnetic field corresponding to the slice in the predetermined region to be measured, so as to obtain the projection data, means for selectively saturating magnetization vectors in the entire region other than the slice in the region to be measured by applying radio frequency waves which are composed of continuous waves the frequency of which is successively varied through frequencies other than the resonance frequency of the specified atomic nuclei in the region to be measured and means for obtaining the projection data in the plurality of predetermined directions in the slice by measuring the resonance signals by applying the 90° pulses of resonance frequency of the specified atomic nuclei in the region to be measured including the equivalent magnetic field plane regions while the saturation state of magnetization vectors is maintained.

BRIEF DESCRIPTION OF THE DRAWINGS

FIGS. 7(a)-7(f) are a timing diagram for explaining the operational sequence of the invention.

DESCRIPTION OF THE PREFERRED EMBODIMENT

Figure 1A:
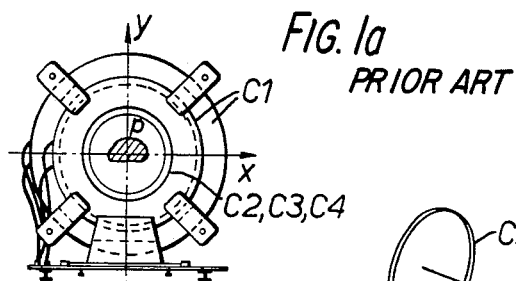
FIGS. 1(a), (b), to 5 are schematic pictorial views for explaining the construction of a conventional apparatus.
Figure 2:
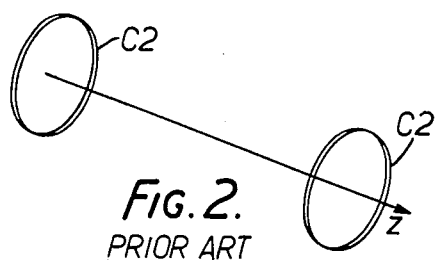
Figure 1B:
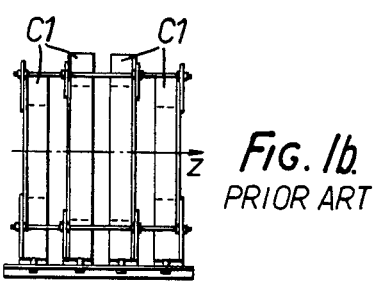
Figure 3:
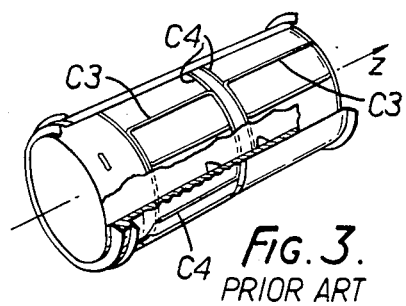
Figure 6:
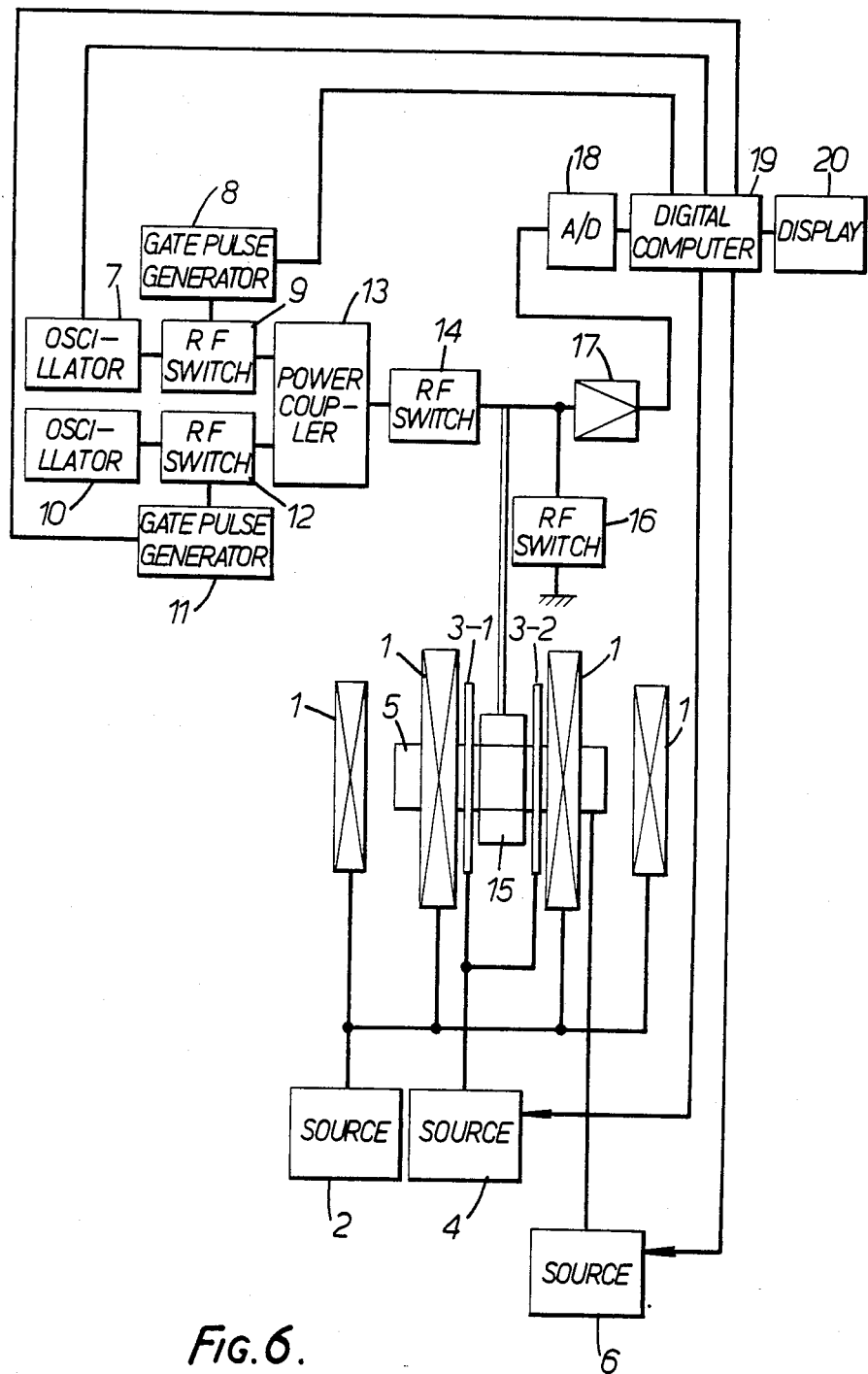
FIG. 6 is a schematic block diagram illustrating the construction of an embodiment of this invention.

Referring to FIG. 6, an electromagnet coil assembly having four coil elements 1 operates to form a uniform static magnetic field similar to coils C1 in FIGS. 1(a) and 1(b). Each of the coils is connected to a D.C. source 2. A pair of coils 3-1 and 3-2 which are preferably Helmholtz-type coils similar to coils C2 shown in FIG. 2, form a linear gradient field along the Z direction of the uniform static magnetic field. Connected to the coils 3-1 and 3-2 is a D.C. source 4 which is controlled by a digital computer 19 described hereinafter so as to control the current in each coil. Coils 5 which are preferably saddle-type coils similar to coils C3 and C4 in FIG. 3 which form a linear gradient magnetic field in the X and Y directions perpendicular to the Z direction of the static magnetic field. Connected to the coils 5 is a D.C. source 6 which is controlled by the computer 19.

A first oscillator 7 generating continuous radio frequency (r.f.) waves is provided for saturating the magnetizations of spin outside the selected region so as to select a well-defined tomographic plane. The r.f. waves are pulse-modulated at a first r.f. switch 9 with gate pulses from a gate pulse generator 8 for magnetization saturation. The r.f. waves delivered from the first oscillator 7 are controlled to continuously change frequencies within a range of frequencies not including the resonance frequency of the specified atomic nuclei in the selected region of specific field intensity to be measured.

Figure 4:
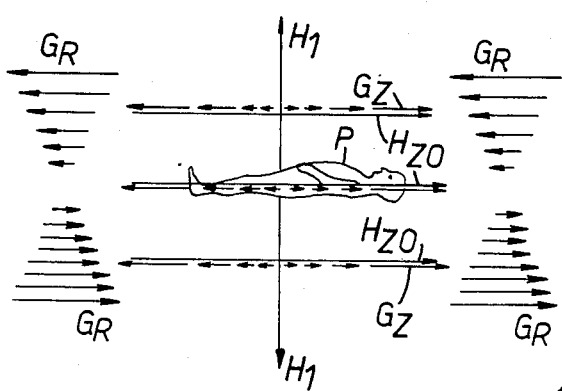

Accordingly, since the continuous waves are applied while generating the gradient magnetic field $G_z$ in the direction along the body axis of the object P in FIG. 4, the selective slice is not resonated because its resonance frequency is not included in the c.w. signals. On the other hand, the region excluding the selected slice is resonated because its corresponding frequency components are included in the c.w. signals.

A second oscillator 10 generates an r.f. signal for exciting the specified atomic nuclei in the selective region of resonance frequency which are pulse-modulated at a second r.f. switch 12 by the gate pulses delivered from a gate pulse generator 11 for delivering 90° pulses. The r.f. signal from the second oscillator 10 is at resonance frequency of the specified atomic nuclei. 90° pulses are generated by switching the r.f. signal at the second r.f. switch 12 in accordance with the gate pulses outputted from the gate pulse generator 11 of a predetermined duration or pulse width necessary to tip the magnetization vector 90° by resonance.

Figure 5:
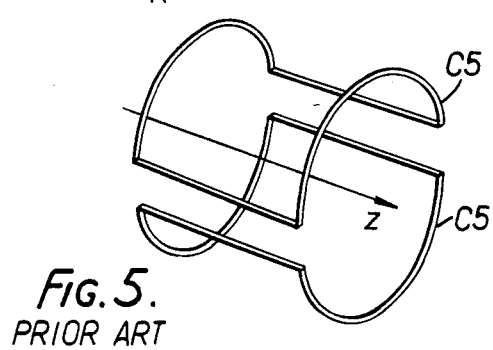

Both the pulse-modulated saturation pulses and 90° r.f. signal pulses are transmitted into a third r.f. switch 14 by a power coupler 13 without interference to the mutual signals while they are applied to an object to be diagnosed through a probe-head 15. The probe-head 15 is composed of coils similar to coils C5 as illustrated in FIG. 5.

Effectively resonance is encouraged by using the c.w. method of excitation in the region other than the slice, and selective excitation pulses are applied at the time when the selective slice is excited. The magnetization vectors of atomic nuclei in the region outside the slice are saturated and NMR signals are obtained after exciting the unsaturated slice with selective excitation pulses.

The third r.f. switch 14 operates to pass only signals of more than a predetermined level for electrically isolating the transmitting side from the probe-head 15 to eliminate noise different from inherent transmitting signals and minute signals such as received signals. A fourth r.f. switch 16 operates to ground excessive input levels appearing during transmission time for protection of the preamplifier in receiver 17.

The resonance signals received and amplified by the receiver 17 are converted into digital signals by an analogue-to-digital (A/D) convertor 18 and digital computer 19 performs an image reconstruction procedure including a record, accumulation, Fourier transformation and so forth. The computer 19 also controls first oscillator 7, gate pulse generators 8 and 11, as well as D.C. sources 4 and 6. A display 20 depicts the images of specified atomic nucleus density distribution which are reconstructed by the computer on a basis of the projection data in the various directions of the density distribution in the object's slice.

In operation, the uniform static magnetic field Ho generated by the coils 1 is applied to the measuring region. Next, the linear gradient magnetic fields Gx, Gy and Gz in the respective x, y and z directions of FIG. 6 are applied to the measuring regions superimposed on the above magnetic field Ho as shown in FIGS. 7(a), 7(b) and 7(c) by flowing current into the coils 3-1, 3-2 and 5.

For selecting the object's slice to be diagnosed the frequency of r.f. signals delivered from the first oscillation 7 is successively varied for the effective duration of gate pulses delivered from the gate pulse generator 8 in the range of frequency corresponding to the unselected region, to saturate the magnetization vector in the unselected region by the continuous wave (c.w.) method. Such r.f. signals are applied to the object through the probe-head 15 to saturate the magnetization vector only in the unselective region by the appropriate range of frequencies. Therefor, it is possible to select the plane of the object perpendicular to the gradient field direction.

Next, the gradient magnetic fields Gx, Gy and Gz are adjusted by changing current in the coils 3-1, 3-2 and 5 to produce the linear gradient magnetic field in the gradient direction corresponding to the desired projection direction. There will be a variation of frequency along the gradient field directions.

The r.f. signal of predetermined frequency delivered from the second oscillator 10 is modulated with the gate pulse delivered from the gate pulse generator 11, such modulated 90° pulses (which are of the so-called burst wave form) are applied to the object through the probe-head 15 to obtain resonance signals. The resonance signals correspond to the projection signals in the direction perpendicular to the gradient field direction. The acquisition of such resonance signals is performed while the magnetization vector in the nonselected region is maintained in the sate of saturation by the c.w. method. The resonance signals are amplified by the receiver 17, digitized by the A/D converter 18 and transmitted into the computer 19. By altering each current value of coils 3-1, 3-2 and 5, the gradient direction of the linear gradient magnetic field is rotated to the various directions in the selected slice. By observing the resonance signals while applying the 90° pulses to the object in each of the various directions, it is possible to obtain the projection data in the directions perpendicular to such various directions.

As one example using an apparatus in accordance with this invention, the resonance frequency of the hydrogen atomic nuclei is about 6.3 MHz if the magnitude of the central magnetic field is 1,500 gauss. Using a linear magnetic field gradient, the frequency range for the c.w. signals corresponding to a slice width of 1 cm is 1.5 $KH_z$. Accordingly, assuming one was measuring the head of object P in FIG. 4, and further assuming the head is 20 cm long along its longitudinal axis, the frequency range of the cw signals to apply to achieve saturation of the head is 30 $KH_z$. The cw signals would be varied through a 15 $KH_z$ range on a center frequency of 6.3 $MH_z$ but without using the center frequency.

Thus, it is possible to reconstruct the density distribution images of specified atomic nuclei in the slice from the projection data in the various directions in the selected slice by the use of techniques of X-ray computerized tomography, the reconstructed density images being depicted on display 20. The significant wave forms for such an operation are illustrated in FIGS. 7(a)-7(f). By magnetization saturation due to the c.w. method as described above, no blur of image is caused at the interface between the selected region and unselected region, thereby eliminating the blur which is caused when selecting the slice by the selective exitation pulse method and sensitive point method. There is an advantage even with phase disturbance of the magnetization vector, since it is possible to obtain the density distribution images of specified atomic nuclei in the selected slice with no blur of the border planes or interface between the selected and unselected regions.

Furthermore, in contrast to the construction using selective exitation pulses from the conventional apparatus utilizing the selective excitation method, the above apparatus is efficient with the use of continuous wave generating means producing c.w. waves for saturating the unselected region and 90° pulse generating means producing 90° pulses. The apparatus of this invention is not complicated.

It will be apparent, to those skilled in the art, that modifications and variations can be made in the preferred embodiment disclosed herein without departing from the scope or the spirit of the invention.

For example, in case of acquiring resonance signals by applying 90° pulses to the selected region after the saturation of unselected region, the gradient magnetic field determining a projection direction is not necessarily needed at the application time of 90° pulses. The gradient magnetic field is needed to be applied at least at the acquisition time of resonance signals after the application of 90° pulses.

Also, since the gradient magnetic field is applied to the selected region at the time of saturating the unselective region, it may be a nonlinear gradient magnetic field in place of the linear gradient magnetic field. However, the gradient magnetic field at the time of acquisition of resonance signals after the application of 90° pulses is more desireably a linear gradient magnetic field because the nonlinear one complicates the processing of data. Moreover, the measuring target is not limited to hydrogen atomic nuclei, and there may be other atomic nuclei which are observed.

What is claimed is:

1. Nuclear magnetic resonance diagnostic apparatus for producing the density distribution image of specified atomic nuclei in a slice of an object by image resonstruction procedure on projection data of the specified atomic nuclei density distribution which are achieved in a variety of directions in the plane of said slice of said object by using nuclear magnetic resonance phenomena, the apparatus comprising:
    means for applying a gradient magnetic field to form an equivalent plane in the magnetic field corresponding to said slice in the predetermined region to be measured, so as to obtain said projection data;
    means for selectively saturating magnetization vectors in the entire region other than the region corresponding to said slice in the region to be measured by applying radio frequency waves which are composed of continuous waves the frequency of which is successively varied in a range not inclusive of the resonance frequency of the specific atomic nuclei; and
    means for obtaining the projection data in the predetermined directions in said slice by measuring the resonance signals by applying 90° pulses of resonance frequency of said specified atomic nuclei to the measurable region including the equivalent magnetic field plane region, while said saturation state of magnetization vectors is maintained.

2. The nuclear magnetic resonance diagnostic apparatus of claim 1 wherein the setting of projection direction of the measured resonance signals is performed by applying the gradient magnetic field of the desired magnetic field gradient after selection of the equivalent magnetic field plane.

3. Nuclear magnetic resonance diagnostic apparatus for producing the density distribution image of specified atomic nuclei in a slice of an object by an image reconstruction procedure on projection data of the specified atomic nuclei density distribution in a plurality of directions in the plane of said slice of object by using nuclear magnetic resonance phenomena, the apparatus comprising:
    gradient magnetic field generating means for generating gradient magnetic fields having a magnetic field intensity gradient and three-dimensionally controlling each magnetic field intensity gradient;
    90° pulse generating means for generating 90° pulses, which correspond to the gradient magnetic field to excite to resonance said specified atomic nuclei in the selected region corresponding to the specified slice of the object disposed within the gradient magnetic field;
    continuous wave generating means for generating radio frequency waves which are composed of continuous waves of variable frequency, not including the resonance frequency of the specified atomic nuclei in the selected region, so as to selectively saturate the magnitization vectors in the region out of the selected region and within the gradient magnetic field;
    excitation and detection means for selectively applying to the object disposed within the gradient magnetic field the r.f. signals delivered from said continuous wave generating means and the 90° pulses delivered from said 90° pulse generating means, and for detecting the resonance signals delivered from the object after application of the 90° pulses; and
    control means for controlling the operation of each of said means in accordance with the timing.

4. The nuclear magnetic resonance diagnostic apparatus of claim 3 wherein said gradient magnetic field generating means is provided with a coil apparatus generating the uniform magnetic field and three gradient magnetic field coils for generating the gradient magnetic field, each generating a magnetic field gradient in a direction orthogonal to the other and in superimposition to the uniform static magnetic field.

* * * * *